US006614143B2

(12) United States Patent
Zhang et al.

(10) Patent No.: US 6,614,143 B2
(45) Date of Patent: Sep. 2, 2003

(54) CLASS V FLEXTENSIONAL TRANSDUCER WITH DIRECTIONAL BEAM PATTERNS

(75) Inventors: Jindong Zhang, Lansdale, PA (US); Robert E. Newnham, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 09/942,272

(22) Filed: Aug. 29, 2001

(65) Prior Publication Data

US 2002/0096973 A1 Jul. 25, 2002

Related U.S. Application Data

(60) Provisional application No. 60/228,968, filed on Aug. 30, 2000.

(51) Int. Cl.$^{7}$ .............................................. H01L 41/04

(52) U.S. Cl. ........................ 310/317; 310/317; 310/328

(58) Field of Search ................................ 310/334, 324, 310/369, 328

(56) References Cited

U.S. PATENT DOCUMENTS

| | | | | |
|---|---|---|---|---|
| 2,895,062 A | * | 7/1959 | Abbott | 310/334 |
| 4,845,688 A | * | 7/1989 | Butler | 367/163 |
| 4,999,819 A | | 3/1991 | Newnham et al. | 367/157 |
| 5,276,657 A | | 1/1994 | Newnham et al. | 367/157 |
| 5,729,077 A | | 3/1998 | Newnham et al. | 310/328 |
| 6,232,702 B1 | * | 5/2001 | Newnham et al. | 310/324 |

OTHER PUBLICATIONS

Newnham et al. "Cymbal Transducers: A Review." Materials Research Laboratory. The Pennsylvania State University, University Park, PA 16802, 29–32.

International Search Report. PCT/US01/26864, Filed Aug. 29, 2001.

Xu et al. "Piezoelectric composites with high sensitivity and high capacitance for use at high pressures." *IEEE Transactions on Ultrasonics, Ferroelectrics, and Frequency Control*. vol. 38, No. 6, Nov. 1991, 634–639.

Rolt. "History of the flextensional electroacoustic transducer." *J. Acoust. Soc. Am.* 87(3), Mar. 1990, 1340–49.

Zhang et al. "A class V flextensional transducer: the cymbal." *Ultrasonics*. 37 (1999) 387–93.

Dogan et al. "Composite piezoelectric transducer with truncated conical endcaps "cymbal"." *IEEE Transactions on Ultrasonics, Ferroelectrics, and Frequency Control*. vol. 44, No. 3, May 1997, 597–605.

Butler et al. "A low frequency directional flextensional transducer and line array." *J. Acoust. Soc. Am.* 102(1), Jul. 1997, 308–314.

* cited by examiner

*Primary Examiner*—Mark Budd
(74) *Attorney, Agent, or Firm*—Ohlandt, Greeley, Ruggiero & Perle, L.L.P.

(57) ABSTRACT

An electro active device for generating a directional beam includes first and second electro active substrates each having first and second opposed continuous planar surfaces wherein each of the first opposed surfaces have a polarity and each of the second opposed surfaces have an opposite polarity. The first opposed surfaces of the first and second electro active substrates are in close contact. A first electrode is coupled to a junction formed by the first opposed surfaces having the same polarity, a second electrode is coupled to the second opposed surface of the first electro active substrate, and a third electrode is coupled to the second opposed surface of the second electro active substrate. A first endcap is joined to the second opposed surface of the first electro active substrate and a second endcap is joined to the second opposed surface of the second electro active substrate.

16 Claims, 6 Drawing Sheets

MONOPOLE. (IN PHASE. SAME AMPLITUDE), $V_b = V_f = V_m$, $\varphi = 0$

DIPOLE. (OUT OF PHASE. SAME AMPLITUDE), $V_b = -V_d$, $V_f = V_d$, $\varphi = \pi$ CARDIOID. $V_b / V_f = (1-R)/(1+R)$, WHERE $R = TVR_m / TVR_d$, $0 < \varphi < \pi$ 15kHz, $V_f$ = 100 V, $V_b$ = 55V, $\varphi$ = 237°

20kHz, $V_f$ = 100 V, $V_b$ =38V, $\varphi$ = 268°

80kHz, $V_f$ = 98 V, $V_b$ =100V, $\varphi$ = 332°

CLASS V FLEXTENSIONAL TRANSDUCER WITH DIRECTIONAL BEAM PATTERNS

PRIORITY

This Application claims priority from U.S. Provisional Application Serial No. 60/228,968, filed Aug. 30, 2000.

GOVERNMENT SUPPORT

This invention was funded under a contract with the Office of Naval Research and by the Advanced Research Projects Agency, Grant #N00014-96-1-1173. The Government has certain rights in the invention.

BACKGROUND OF THE INVENTION

1. Field of the Invention

The present invention relates to electro active devices, and in particular, to a directional flextensional transducer.

2. Description of the Prior Art

Electro active devices in the form of flextensional transducers were first developed in the 1920s and have been found to be particularly useful for underwater acoustic detection and transmission since the 1950s. They typically comprise an active piezoelectric or magnetostrictive drive element coupled to a mechanical shell structure. The shell is used as a mechanical transformer which transforms the high impedance, small extensional motion of the ceramic into a low-impedance, large flexural motion of the shell. The term "flextensional" is derived from the concept of the extensional and contractional vibration of the drive element causing a flexural vibration of the shell. Flextensional transducers have been divided into seven classes according to the shape of the shell and the configuration of the drive elements. For example, a Class I transducer has a shell similar to an American football in shape. The drive motor is typically a stack of drive elements oriented along the major axis of the shell. A Class II transducer is essentially a modified Class I shape having extensions along the major axis. A Class V transducer, applicable to this application, typically includes a radially vibrating ring or disk as a drive element, as opposed to a linear stack of drive elements oriented along a major axis of the shell. The radially vibrating ring or disk is usually sandwiched between two spherical cap shells.

Flextensional transducers may range in size from several centimeters to several meters in length and can weigh up to hundreds of kilograms. They are commonly used in the frequency range of 300 to 3000 Hz. Such transducers can operate at high hydrostatic pressures, and have wide bandwidths with high power output.

Two electro active devices, versions of the Class V flextensional transducer, called the "moonie" and the "Cymbal™" have been developed at the Materials Research Laboratory at the Pennsylvania State University (Cymbal™ is a trademark of the Pennsylvania State University). The moonie and Cymbal™ can be constructed using bonding and fabrication processes that are very simple, therefore, they can be inexpensive and easy to mass-produce.

An example of a moonie transducer is described in U.S. Pat. No. 4,999,819. The moonie acoustic transducer utilizes a sandwich construction and is particularly useful for the transformation of hydrostatic pressures to electrical signals.

U.S. Pat. No. 5,276,657 describes a moonie ceramic actuator similar to that shown in FIG. 1. A piezoelectric or electrostrictive element 100 is sandwiched between a pair of endcaps 105, 110, with each endcap having a cavity 115, 120 formed adjacent to the piezoelectric element 100. The endcaps 105, 110 are bonded to the piezoelectric element 100 to provide a unitary structure. Conductive electrodes 125 and 130 are bonded to the piezoelectric element's major surfaces. When a potential is applied between electrodes 125 and 130, the piezoelectric element 100 expands in its thickness dimension and contracts in its axial dimension, causing endcaps 110 and 105 to bow outward as shown by lines 135 and 140, respectively. The bowing action amplifies the actuation distance created by the contraction of the piezoelectric element 100, enabling the use of the element as an actuator.

U.S. Pat. No. 5,729,077 describes another Class V transducer having sheet metal caps with an outward convex shape, joined to opposed planar surfaces of the ceramic substrate to improve the displacements achievable through actuation of the ceramic disk. Due to the shape of the sheet metal caps, the transducer is commonly known as a Cymbal™ transducer, as mentioned above. An example of a Cymbal™ transducer is shown in FIG. 2. A multi-layer ceramic substrate 200 is interposed between two end caps 205 and 210. The multi-layer substrate 200 includes a plurality of interspersed electrodes 215 and 220. Electrodes 215 are connected together by end conductor 225 to endcap 210 and electrodes 220 are connected together by end conductor 230 to endcap 205. Both endcaps are bonded to multi-layer substrate 200 about their periphery. Application of a potential across electrodes 215 and 220 causes an expansion of multi-layer substrate 200 in its thickness dimension, and contraction in its axial dimension, in a fashion similar to the moonie piezoelectric element 100 described above. As a result, endcaps 205 and 210 pivot about bend points 235, 240 and 245, 250, respectively. As a result of such pivoting, substantial displacement of end surfaces 255 and 260 occurs.

Thus, the structure of piezoelectric element 100 or multi-layer substrate 200 in combination with their respective endcaps convert and amplify the small radial displacement of the element or substrate into a much larger axial displacement normal to the surface of the caps. For underwater applications, this contributes to a much larger acoustic pressure output than would occur when using piezoelectric element 100 or multi-layer substrate 200 alone.

The moonie and Cymbal™ transducers are capable of being constructed so as to be small compared to the wavelength of sound they produce in a usable frequency range, which is usually near their first resonance frequency. In addition, most of the radiating surface area of the shells moves in phase. As a result, the resulting acoustic radiation pattern is nearly omni directional, resembling an acoustic monopole. The omni directional characteristics of flextensional transducers create significant problems in projection transducer and array applications designed to transmit in one direction. At the present time, rows of transducers are carefully arranged and phased, or large baffles are used to produce the desired beam patterns. This is expensive, time-consuming and cumbersome. It would be desirable to construct and operate a Class V flextensional transducer that would be capable of generating a directional radiation pattern.

Butler et al., in "A Low Frequency Directional Flextensional Transducer," J. Acoust. Soc. Am., vol. 102, July 1997, pp. 308–314, propose a method for generating a directional beam using a Class IV flextensional transducer by exciting both an extensional mode and a bending mode simultaneously. Butler et al. is directed to operating a Class IV transducer, in the 900 Hz range. The shell has an elliptical shape and the transducer is driven by a linear, rectangular stack of drive elements oriented along the major axis of the shell. The transducer disclosed by Butler et al. has overall dimensions of 19.4 inches long, 9.5 inches wide, and 20.3 inches high, and an in air weight of 350 lbs. In addition, Butler et al. discloses assembling six transducers in a line array with 20 inch center to center spacing. Thus the assembled array measures 10 feet long and weighs approximately 2100 lbs.

Prior to this application, there is no known method or apparatus for driving a Class V flextensional transducer to produce a directional beam.

SUMMARY OF THE INVENTION

An electro active device for generating a directional beam includes first and second electro active substrates each having first and second opposed continuous planar surfaces wherein each of the first opposed surfaces have a polarity and each of the second opposed surfaces have an opposite polarity. The first opposed surfaces of the first and second electro active substrates are in close contact. A first electrode is coupled to a junction formed by the first opposed surfaces having the same polarity, a second electrode is coupled to the second opposed surface of the first electro active substrate, and a third electrode is coupled to the second opposed surface of the second electro active substrate. A first endcap is joined to the second opposed surface of the first electro active substrate and a second endcap is joined to the second opposed surface of the second electro active substrate.

The first and second electro active substrates may be disc shaped, and the first opposed surfaces of the first and second electro active substrates may be bonded by a conductive layer to form the junction. The first and second electro active substrates may be formed of an electrostrictive material, and/or a piezoelectric material. If the substrates are formed of a piezoelectric material, the substrates may also be poled in a direction perpendicular to their first and second opposed planar surfaces.

The first and second endcaps may comprise a truncated conical shape and a rim portion. The rim portion of the first endcap may be joined to the second opposed surface of the first substrate, and the rim portion of the second endcap may be joined to the second opposed surface of the second substrate.

The electro active device may also include circuitry for applying a first electric field across the first and second electrodes, and circuitry for applying a second electric field across the first and third electrodes, where the second electrical field has a phase relationship with the first electrical field, and where the application of the first and second electrical fields causes the electro active device to produce a combined flexural and bending motion.

A vibration production system may be constructed from a plurality of the electro active devices by arranging the devices in an array.

BRIEF DESCRIPTION OF THE DRAWINGS

The above set forth and other features of the invention are made more apparent in the ensuing Detailed Description when read in conjunction with the attached Drawings, wherein.

DETAILED DESCRIPTION OF THE INVENTION

Principle of Operation

A directional beam pattern can be achieved by the cancellation of sound pressure in one direction (back side) and the addition of sound pressure in the opposite direction (front side). This is accomplished by exciting the transducer in a combined flexural and bending motion.

Figure 3:
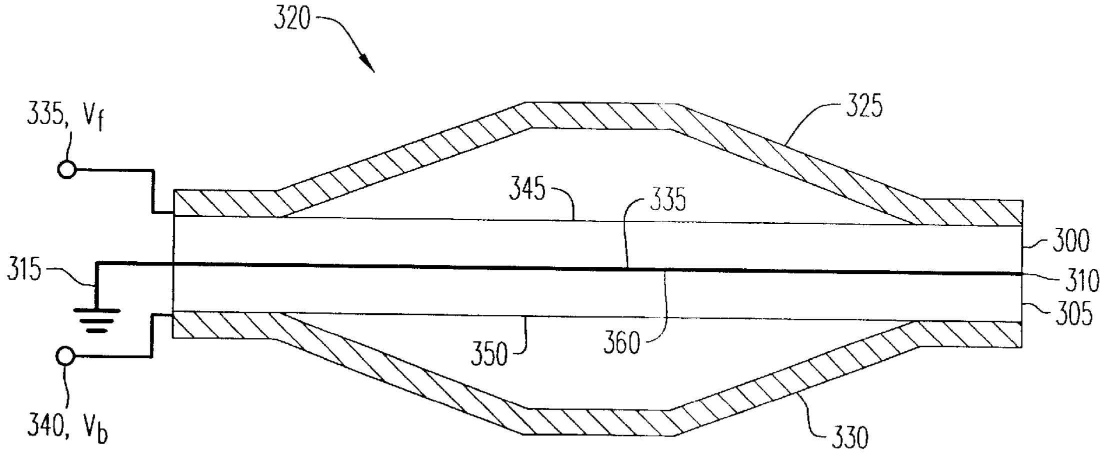
FIG. 3 is a cross sectional view of a Double Driver™ transducer in accordance with the present invention.

FIG. 3 is a cross sectional view of a Class V electro active device configured as a Double Driver™ transducer 320 in accordance with the present invention (Double Driver™ is a trademark of the Pennsylvania State University). Two electro active elements 300, 305 each have opposed continuous planar surfaces 345, 355 and 350, 360, respectively. Electro active elements 300, 305 are bonded together to conductive layer 310. Electro active elements 300, 305 are bonded together such that their opposing planar surfaces 355, 360 have the same polarity. Conductive layer 310 is preferably comprised of a conductive material, for example, a brass shim bonded to opposing surfaces 355, 360 using a conductive epoxy. In one embodiment, the brass shim may have a thickness of approximately 0.004 inches. Conductive layer 310 is connected to a ground through electrode 315. Electrode 335 is coupled to surface 345 of electro active element 300, while electrode 340 is coupled to surface 350 of electro active element 305.

Electro active elements 300, 305 thus form a Double Driver™ configuration, that is, according to the teachings of this invention, a configuration where at least two electro active elements are capable of being driven independently.

Electro active elements 300, 305 are interposed between two end caps 325, 330. Endcap 325 is bonded to electro active element 300 at its periphery or rim, while endcap 330 is bonded to electro active element 305 around its own periphery or rim.

While electro active elements 300, 305 are described hereinafter as piezoelectric elements, it should be understood that elements 300, 305 may be constructed of any electro active material suitable for the applications described herein. For example, elements 300, 305 may comprise piezoelectric materials based primarily on the lead zirconate titanate (PZT) family including PLZT ($(Pb,La)(Zr,Ti)O_3$). Elements 300, 305 may also comprise electrostrictive ceramic materials such as lead magnesium niobate (PMN)-based ceramics, of which lead titanate-modified PMN (PMN-PT) may be preferred. Other materials may include $Pb(Sn,Zr,Ti)O_3$ ceramics exhibiting antiferroelectric-to-ferroelectric transitions with an applied field.

In a preferred embodiment, endcaps 325, 330 have a Cymbal™ shape. While the invention is described below as having endcaps with a Cymbal™ shape, it should be understood that endcaps 325, 330 may have any other shape that may be suitable for practicing the teachings herein.

It should also be understood that while endcaps 325, 330 are described below as being metal endcaps, endcaps 325, 330 may be made of any material suitable for the applications described herein. The actual material used for endcaps 325, 330 may be application dependent. For example, in applications where displacement is the principal objective (with low forces), aluminum or copper-based metals are preferred. If an application requires substantial force in the displacement action, a stiffer metal such as tungsten may be preferred. End caps 325, 330 can be made of other metals, such as brass, bronze, kovar, zirconium, and titanium. End caps 325, 330 may also be made of polymers and polymer based composites and glass-based materials.

If the two electro active elements 300, 305 are constructed of piezoelectric material, they may be poled in their thickness dimension before bonding. The thickness dimension may be defined as the dimension perpendicular to the opposing coplanar surfaces 345, 355 and 350, 360 that define electro active elements 300 and 305, respectively.

Poling is a process used to align the structure domains of a ceramic in order to obtain the piezoelectric effect. It is typically performed by applying a high DC voltage at an elevated temperature. The poling voltage and temperature profiles are dependent upon the application.

Figure 4A:
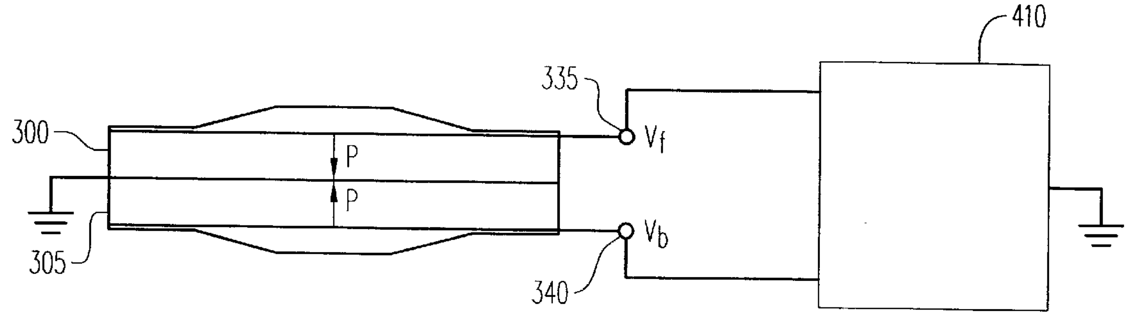
FIGS. 4A–4C show different driving schemes for a Double Driver™ transducer.

When the two piezoelectric elements 300, 305 of the Double Driver™ configuration are driven in phase with the same electric field as shown in FIG. 4A, $V_b=V_f$, where $V_b$ represents the electric field applied to piezoelectric element 305 and $V_f$ represents the electric field applied to piezoelectric element 300. Circuitry 410 provides for the application of selectable electric fields, either alone or in combination, to the electro active elements 300, 305 through electrodes 335 and 340, respectively, in any amplitude and phase relationship suitable for the purposes of this invention. In a preferred embodiment, circuitry 410 provides for the application of electric fields that cause the Double Driver™ transducer to operate at a frequency having an approximate range of 1–100 kHz.

Figure 4B:
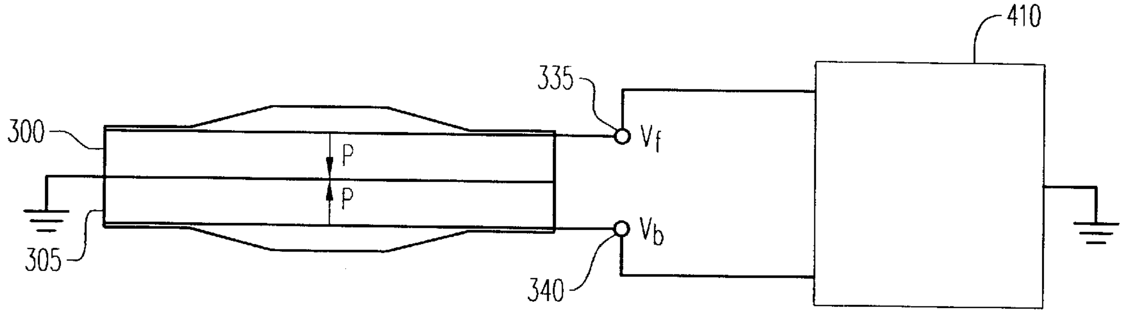
Figure 5A:
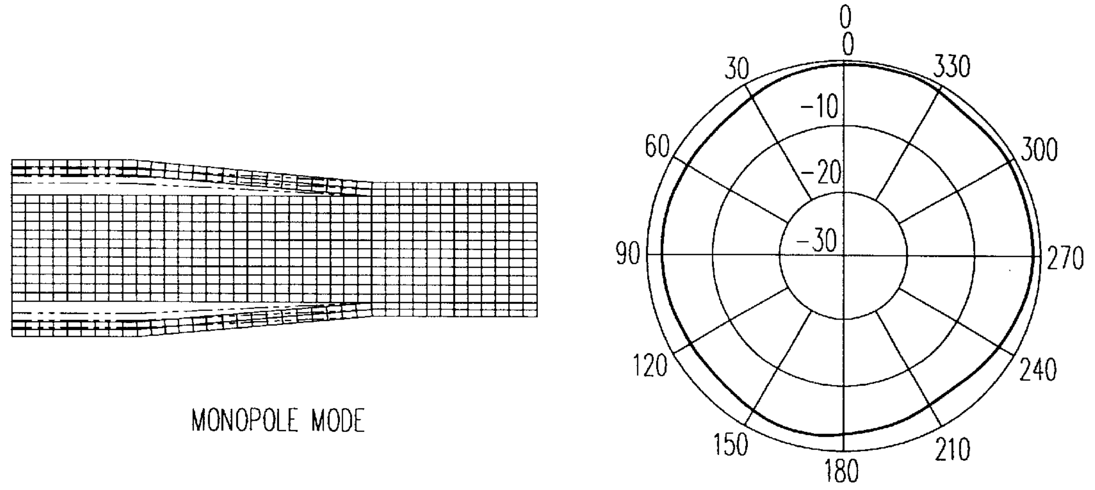
FIGS. 5A–5C show the vibration modes and predicted beam patterns for the driving schemes of FIGS. 4A–4C, respectively.
Figure 5B:
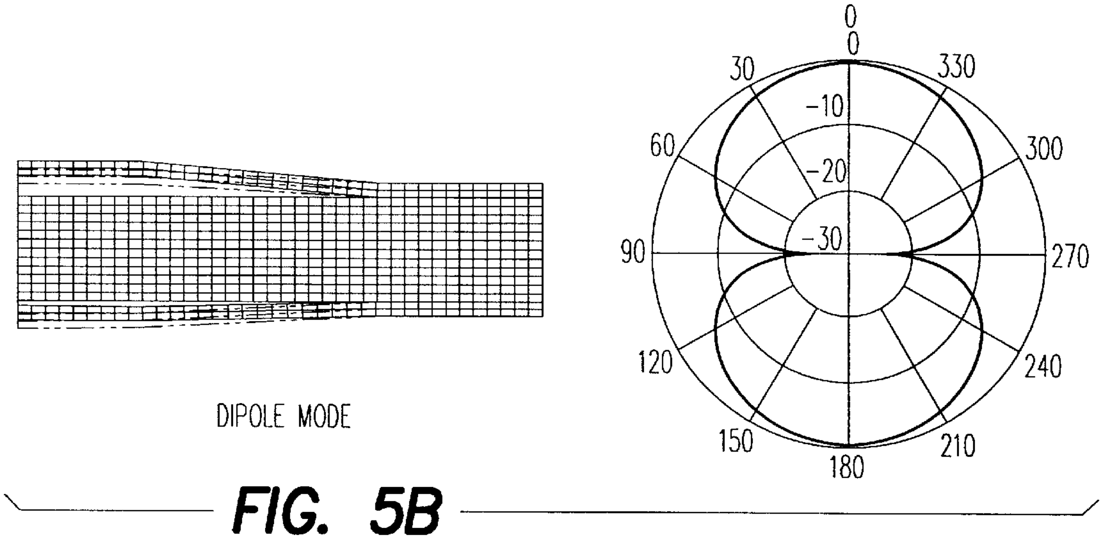

Driving both electro active elements 300, 305 in phase with the same electric field causes a pure flextensional mode to be excited in the transducer and a near omni directional beam pattern (monopole) is obtained as shown in FIG. 5A. To excite a dipole mode (bending mode of the double-driver), the two electro active elements 300, 305 are driven with the same electric field but with a phase difference of 180 degrees as shown in FIG. 4B, resulting in a dipole vibration and a dipole beam pattern as shown in FIG. 5B.

In the dipole mode (i.e., bending mode) of Double Driver™ transducer 320, the Transmit Voltage Response (TVR) shows two maxima in opposite directions (front and back), but the phase of the TVR output from one lobe is opposite to that from the other. When combined with the omni directional mode, this can be used to generate a directivity pattern which has only one maximum. If the output from the dipole mode is added to the output from a monopole mode of equal TVR, the resulting beam pattern is a cardioid curve with a single maximum.

Figure 4C:
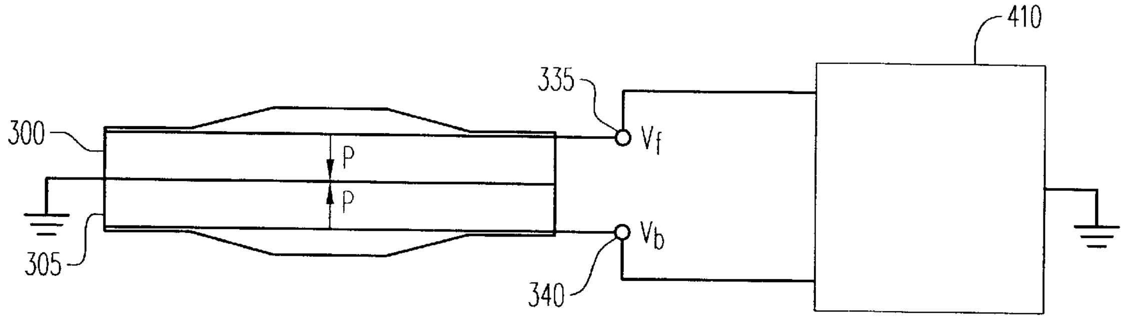

The complex drive conditions shown in FIG. 4C combine the monopole and dipole modes to obtain the directional mode. As mentioned above, $V_b$ represents the electric field applied to piezoelectric element 305 and $V_f$ represents the electric field applied to piezoelectric element 300. $V_m$ and $V_d$ represent the driving fields associated with the monopole and dipole drive conditions. The relationships among the fields may be represented as follows:

$$V_f=V_m+V_d \qquad (1)$$

$$V_b=V_m-V_d \qquad (2)$$

From equations (1) and (2) we obtain:

$$\frac{V_b}{V_f}=\frac{1-r}{1+r} \qquad (3)$$

where $$r=\frac{V_d}{V_m}$$

The transmit voltage response (TVR) is related to the voltage by $$TVR_b=\frac{p_b}{V_b}$$

and $$TVR_f=\frac{p_f}{V_f}$$

where p is the measured sound pressure. In order to produce a directed beam, it would be advantageous to minimize the sound pressure on one side of double driver transducer 320, while maximizing the sound pressure on the other side. For example, to cancel the sound pressure completely in the piezoelectric element 305, the pressure amplitudes should be equal, leading to:

$$\frac{V_b}{V_f}=\frac{1-R}{1+R} \qquad (4)$$

where $$R=\frac{TVR_m}{TVR_d}$$

The complex ratio R is determined from the measured monopole and dipole constant voltage transmitting responses. The equation gives the ratio of the voltages and the phase lag (p on each side of the Double Driver™ transducer.

Computer Simulation

A finite element analysis program, ATILA, was used to model the performance of double driver transducer 320. ATILA was developed at the Acoustics Department at Institut Superieur d'Electronique du Nord (ISEN) to model underwater transducers and has been used successfully in the simulation of flextensional transducers. Mode analysis is carried out to determine the vibration modes, their resonance and anti-resonance frequencies, and associated coupling factors. Through harmonic analysis, the in-air and in-water impedance and displacement field can be computed as a function of frequency, together with the Transmitting Voltage Response, Free Field Voltage Sensitivity, and the directivity patterns. In this study, ATILA was primarily used to determine the vibration modes and calculate the TVR and beam pattern of the double driver transducer 320.

Figure 1:
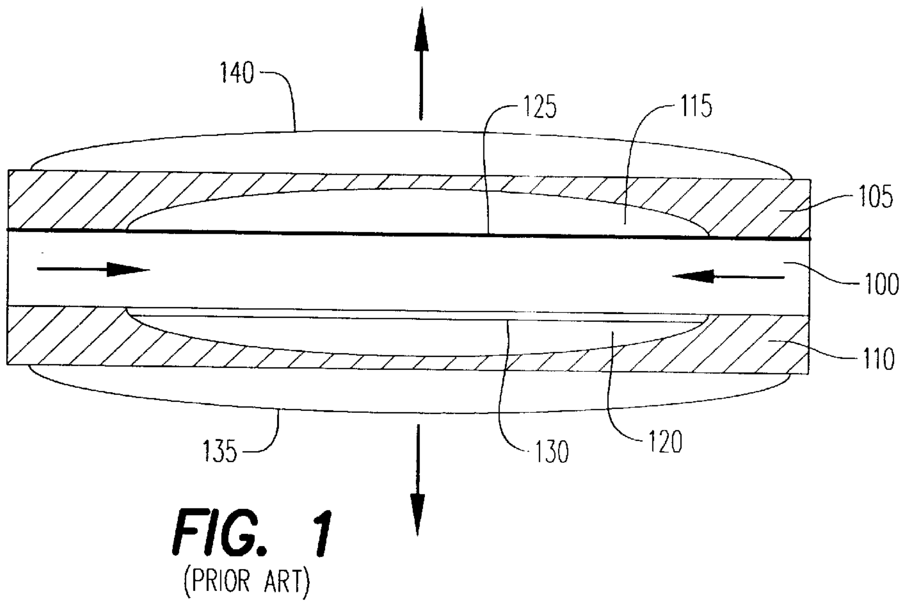
FIG. 1 (PRIOR ART)
FIG. 1 is a cross sectional view of a moonie transducer according to the prior art.
Figure 2:
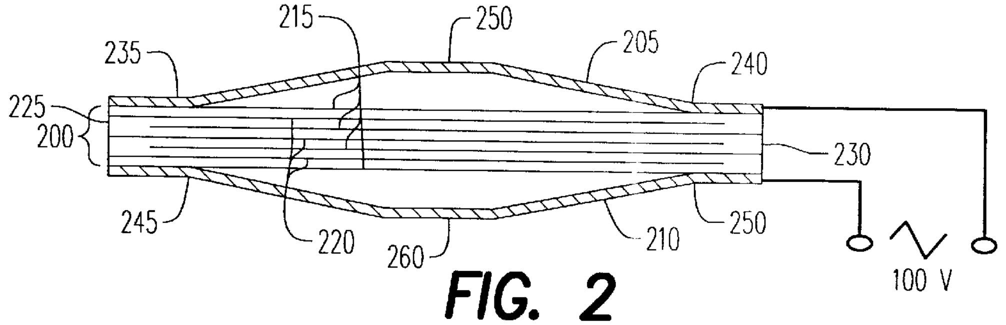
FIG. 2 (PRIOR ART)
FIG. 2 is a cross sectional view of a Cymbal™ transducer according to the prior art.
Figure 5C:
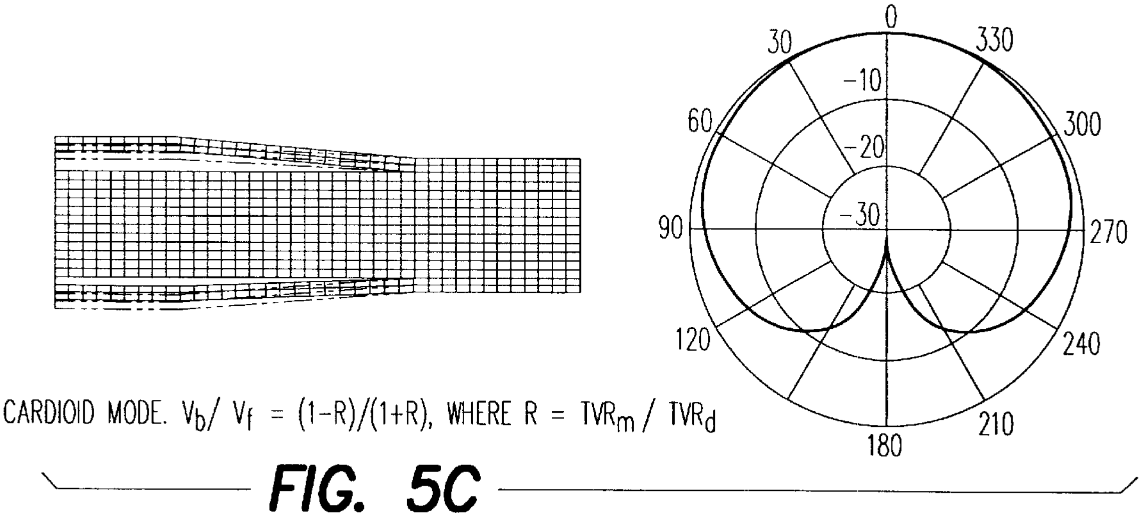

FIGS. 5A–5C show the calculated modes of the Double Driver™ transducer under different driving conditions. In the monopole mode shown in FIG. 5A, the two caps vibrate in phase, and the finite element analysis predicts that the beam pattern is omni directional as shown in FIG. 2*a*. In the dipole mode, the two caps vibrate out of phase, and the predicted beam pattern shown in FIG. 5B is a dipole with two maxima in the front and back directions. The amplitude is predicted to be the same in the two directions but there is a predicted phase difference of 180 degrees. The finite element analysis was performed for the monopole and dipole modes and TVR amplitudes and phases were calculated at a frequency of 20 kHz. The driving conditions for the cardioid mode were then calculated using Equation (1). The driving voltages and phases at 20 kHz predicted by the finite element analysis for the cardioid mode are listed in Table I and the corresponding predicted vibration mode and beam pattern are shown in FIG. 5C.

The two endcaps 325, 330 (FIG. 3) of Double Driver™ transducer 320 vibrate with a phase difference, which causes the sound pressure to increase in the forward direction and decrease in the back, or rearward direction, thereby producing the desired cardioid beam pattern.

Experimental Procedure

Piezoelectric ceramic disks, also referred to as PZT disks (PKI 55, Piezokinetics, Bellefonte, Pa.), were obtained having a thickness of 1 mm and a diameter of 12.7 mm. The PZT disks were poled in the thickness direction. The PZT disks were also ground with sand paper to remove the oxide layer and then cleaned with acetone. Using conductive epoxy, the PZT disks were then bonded together in pairs with opposite polarization directions in a Double Driver™ arrangement.

Titanium endcaps were punched from Ti foil having a thickness of 0.25 mm and shaped using a special die. The shaped endcaps had a diameter of 12.7 mm. The cavity diameter was 9.0 mm at the bottom and 3.2 mm at the top. The cavity depth was 0.2 mm. The flanges of the Ti endcaps were slightly roughened using sand paper. The endcaps were then bonded to the piezoelectric ceramic Double Driver™, resulting in an electro active device configured as a Double Driver™ Cymbal™ transducer. The bonding material was an Emerson and Cuming insulating epoxy. A ratio of three parts 45 LV epoxy resin to one part 15 LV hardener was used. The thickness of the epoxy bonding layer was approximately 20 um. The entire assembly was kept under uniaxial stress in a special die for 24 hours at room temperature to allow the epoxy time to cure.

Underwater calibration tests of individual double driver transducers were performed at the Applied Research Laboratory at the Pennsylvania State University. The testing tank measures 5.5 m in depth, 5.3 m in width, and 7.9 m in length. A pure tone sinusoidal pulse signal of 2 msec duration was applied to a test transducer and its acoustic output was monitored with a standard F33 hydrophone. The transducer under test and a standard transducer were positioned at a depth of 2.74 m and separated by a distance of 3.16 m. The Double Driver™ transducer was potted with a polyurethane coating about 0.5 mm thick. The polyurethane layer insulates the Cymbal™ transducer from the conductive water in the water tank. The measured parameters were the mechanical Q, Transmitting Voltage Response (TVR) and beam pattern.

Figure 6A:
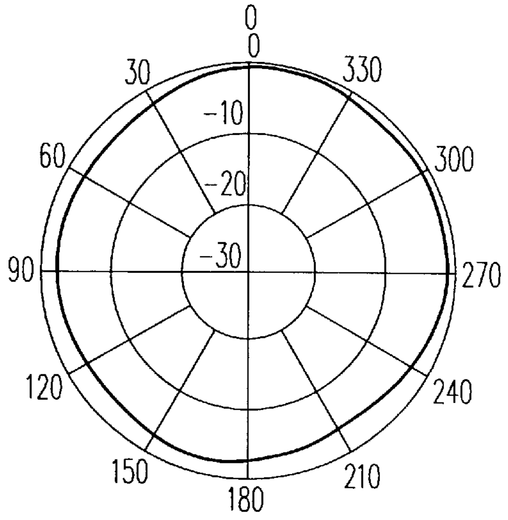
FIG. 6A shows an actual beam pattern measured while driving the Double Driver™ transducer in a monopolar mode.
Figure 6B:
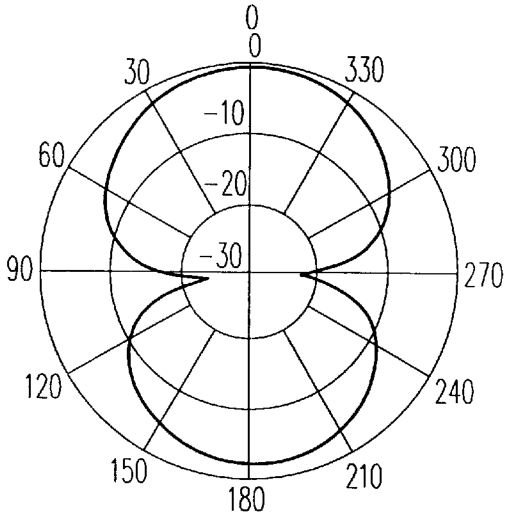
FIG. 6B shows an actual beam pattern measured while driving the Double Driver™ transducer in a dipolar mode.
Figure 7A:
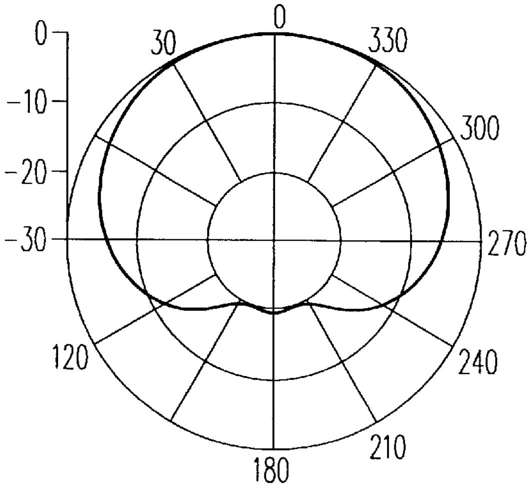
FIG. 7A shows an actual beam pattern measured while driving the Double Driver™ transducer in a cardiod mode according to calculated voltage and phase parameters.
Figure 7B:
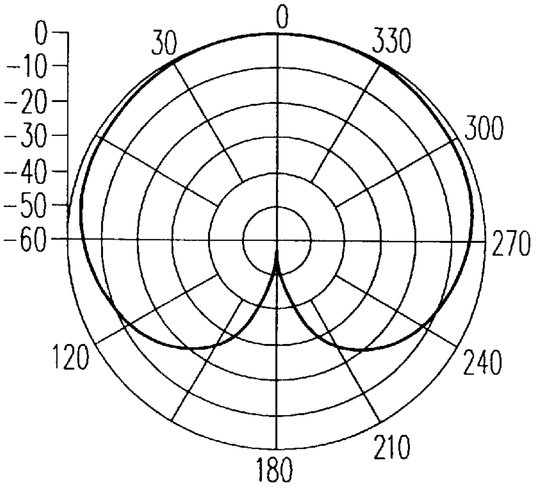
FIG. 7B shows an actual beam pattern measured while driving the Double Driver™ transducer in a cardiod mode according to voltage and phase parameters adjusted for optimum results.

The Double Driver™ transducer was first tested in the monopole and dipole modes. The TVR including amplitude phase and beam pattern were measured at 20 kHz. The measured beam pattern of the monopolar mode is shown in FIG. 6A while the measured beam pattern of the dipole mode is shown in FIG. 6B. A nearly omni-directional pattern was obtained for the monopole mode, and a dipolar beam pattern was obtained for the dipole mode. These patterns agreed well with the finite element analysis prediction. The driving voltages and phases for the cardioid mode at 20 kHz were calculated from the measured TVR amplitudes and phases for the monopole and dipole case according to Equation (1) and the values are listed in Table I. The resulting experimental beam pattern is shown in FIG. 7A. While not a perfect cardioid pattern, the pattern does show a very directional beam shape. When the driving amplitude and the phase of the back side (piezoelectric element 305, FIG. 3) were adjusted slightly, a nearly perfect cardioid beam pattern as shown in FIG. 7B was obtained.

As mentioned above, the experimentally obtained driving conditions for the cardioid pattern are shown in Table 1 as well as the predicted conditions from the finite element analysis program. The voltage amplitude calculated from the finite element analysis program agrees well with the experimental data. However, the calculated phase is significantly different from the experimentally obtained values. It is obvious that the finite element analysis program can predict the TVR amplitude of the Double Driver™ transducer very well. However, the phase of the TVR is complicated by many experimental factors and therefore difficult to predict. Hence, the driving conditions to achieve unidirectional beam patterns must be obtained experimentally.

TABLE 1

Driving voltages and phases for the directional mode at 20 kHz

| | $V_f$ | | $V_b$ | |
|---|---|---|---|---|
| | amplitude | phase | amplitude | phase |
| ATILA | 100 | 0° | 73.8 | 51° |
| Experimental (calculated) | 100 | 164° | 78 | 0° |
| Experimental (adjusted) | 100 | 166° | 72 | 0° |

The experimental procedures demonstrate that a directional beam pattern can be obtained from a Double Driver™ transducer which is much smaller than the wavelength being produced. With this method, a directional pattern can be obtained at virtually any frequency. However, the TVR amplitude and phases of the Double Driver™ transducer fluctuate drastically with frequency. As a consequence, the calculated voltage ratios (amplitude and phase) at different frequencies are significantly different, suggesting unique driving conditions at each frequency or a narrow working bandwidth. This may complicate the driving electronic circuits if the double driver is used over a wide frequency range.

Figure 8A:
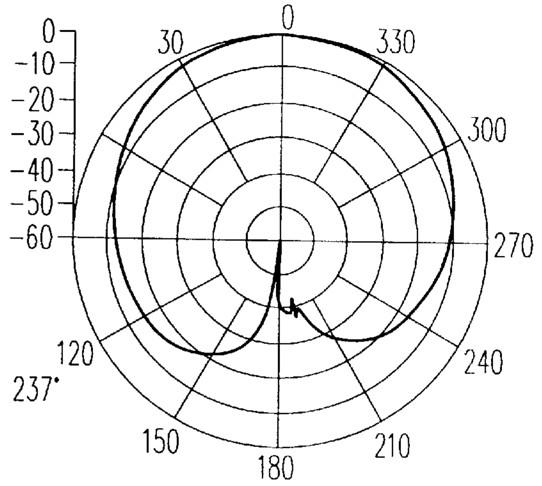
FIGS. 8A–8C show beam patterns of a 3 by 3 array of Double Driver™ transducers driven at 15 kHz, 20 kHz and 80 kHz, respectively.
Figure 8B:
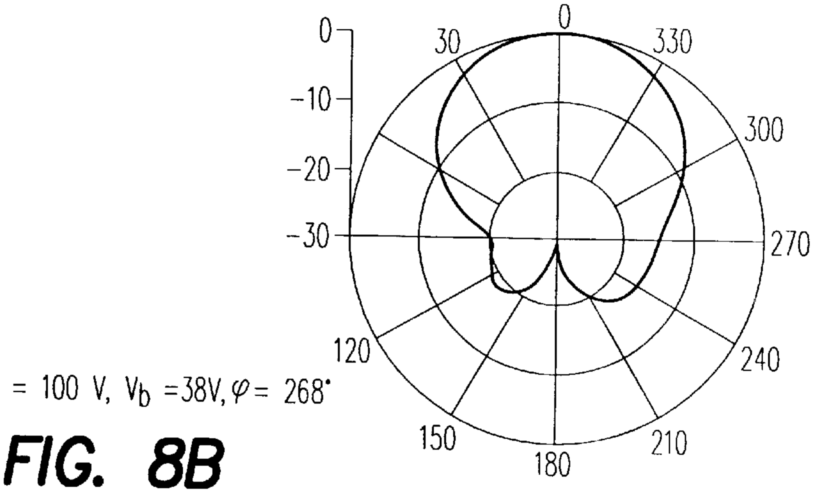
Figure 8C:
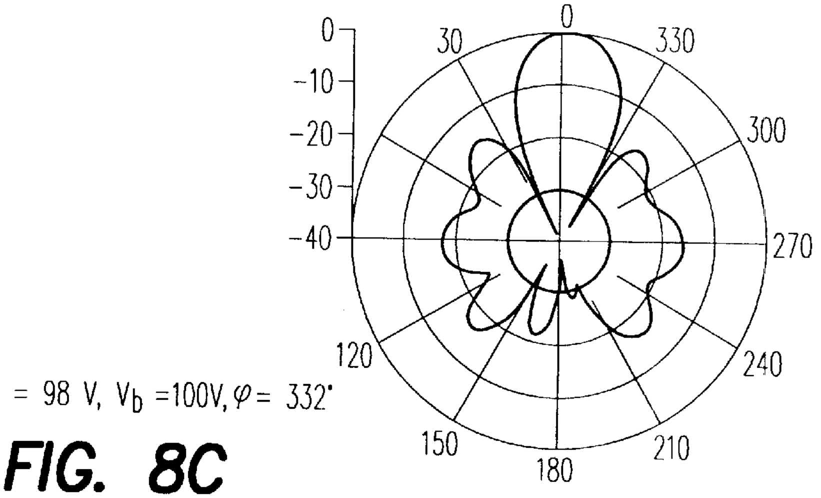
Figure 9:
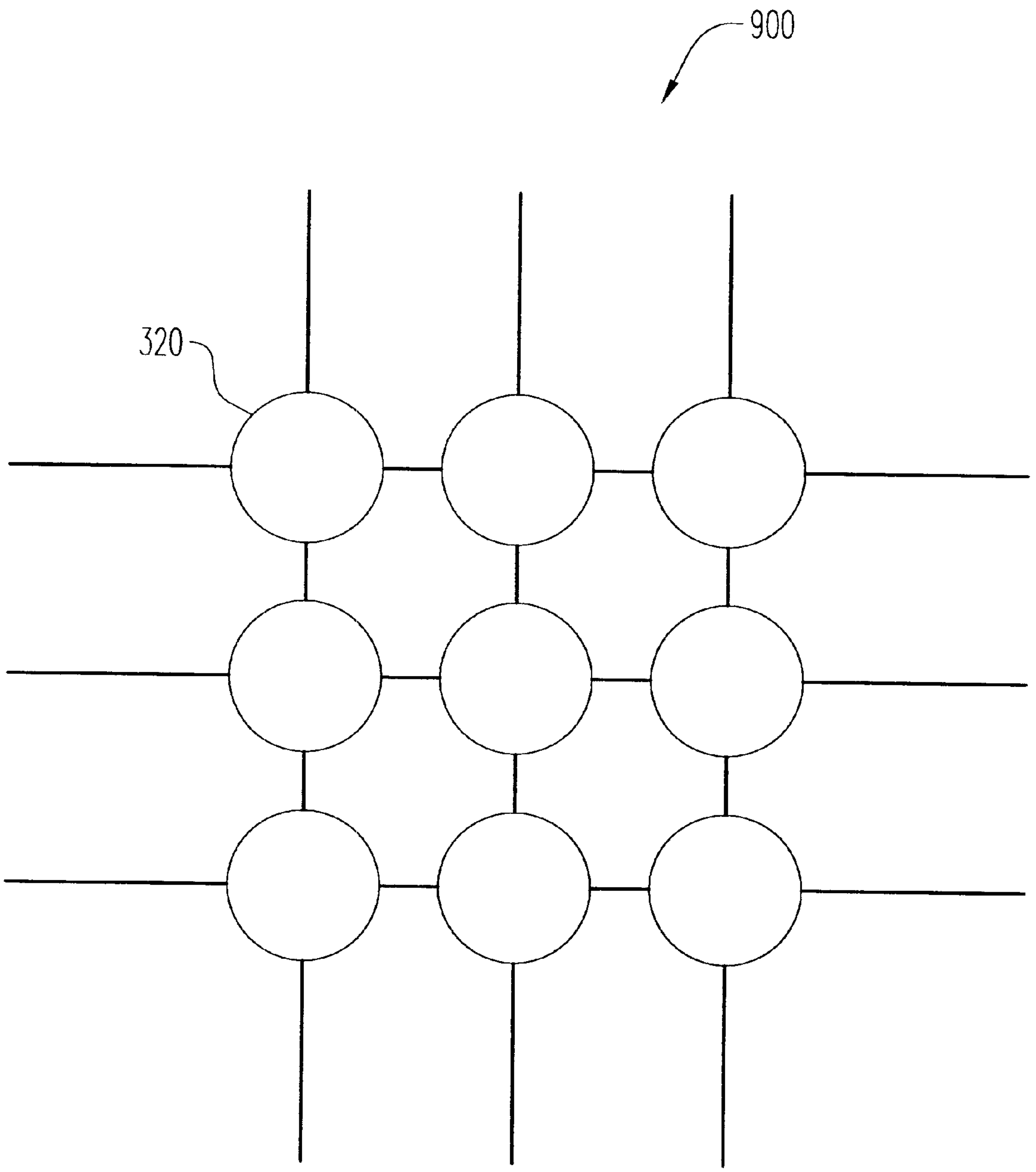
FIG. 9 shows a diagram of a vibration production system made up of a 3 by 3 planar array of Double Driver™ transducers.

Referring to FIG. 9, a vibration production system 900 made up of a 3 by 3 planar array of Double Driver™ transducers 320 was built using the same construction and potting techniques described above and tested without a baffle. It was found that Equation (4) cannot be used for predicting the driving conditions for the array. The difficulty is most probably caused by array interactions. Because of array interaction, the vibration velocity and phase vary for individual transducers in the array, which complicates the driving conditions. Therefore, the driving voltage and phases for the array were adjusted manually to obtain the desired directed beams. The resulting beam patterns of the arrays at 15 kHz, 20 kHz and 80 kHz are shown in FIGS. 8A–8C, respectively. In all cases, a front to back ratio of above 20 dB was obtained.

The Double Driver™ transducer has many possible applications, such as hydrophone applications, various actuator applications, displacement transducers, micropositioners, optical scanners, micromanipulators, linear micromotors, relays, microvalves, accelerometers, and driving elements for active vibration control. Other applications may include micropump applications and ultrasonic guidance systems. Medical applications could include biomedical ultrasonic imaging, drug delivery systems both external and internal to the body, and hearing aid applications including those that are internal and external to the body.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. An electro active device for generating a directional beam comprising:

first and second electro active substrates each having first and second opposed continuous planar surfaces wherein each of said first opposed surfaces have a polarity and each of said second opposed surfaces have an opposite polarity, wherein said first opposed surfaces of said first and second electro active substrates are in close contact;

a first electrode coupled to a junction formed by said first opposed surfaces having the same polarity;

a second electrode coupled to said second opposed surface of said first electro active substrate;

a third electrode coupled to said second opposed surface of said second electro active substrate;

a first endcap joined to said second opposed surface of said first electro active substrate;

a second endcap joined to said second opposed surface of said second electro active substrate;

first circuitry for applying a first electric field across said first and second electrodes; and second circuitry independent of said first circuitry for applying a second electric field across said first and third electrodes, said second electrical field having a phase relationship with said first electrical field, wherein the application of said first and second electrical fields causes an amplitude and phase relationship such that said electro active device produces a combined flexural and bending motion generating said directional beam.

2. The electro active device of claim 1, wherein said first and second electro active substrates are disc shaped.

3. The electro active device of claim 1, wherein said first opposed surfaces of said first and second electro active substrates are bonded by a conductive layer to form said junction.

4. The electro active device of claim 1, wherein said first and second electro active substrates are formed of an electrostrictive materials.

5. The electro active device of claim 1, wherein said first and second electro active substrates are formed of a piezoelectric material.

6. The electro active device of claim 5, wherein said first and second electro active substrates are poled in a direction perpendicular to their respective first and second opposed continuous planar surfaces.

7. The electro active device of claim 1, wherein said first endcap further comprises a truncated conical shape and a rim portion joined to said second opposed surface of said first electro active substrate.

8. The electro active device of claim 1, wherein said second endcap further comprises a truncated conical shape and a rim portion joined to said second opposed surface of said second electro active substrate.

9. A method for generating a directional beam utilizing an electro active device comprising first and second electro active substrates each having first opposed planar surfaces of the same polarity in close contact, said first and wherein said first and second electrical fields have an amplitude and phase relationship such that said electro active device produces a combined flexural and bending motion.

10. The method of claim 9, wherein said first and second electro active substrates are disc shaped.

11. The method of claim 9, wherein said first opposed surfaces of said first and second electro active substrates are bonded by a conductive material to form a junction.

12. The method of claim 9, wherein said first and second electro active substrates are formed of an electrostrictive material.

13. The method of claim 9, wherein said first and second electro active substrates are formed of a piezoelectric material.

14. The method of claim 13, further comprising poling said first and second electro active substrates in a direction perpendicular to their respective first and second opposed planar surfaces.

15. The method of claim 9, wherein each endcap each further comprises a truncated conical shape and a rim portion joined to said second opposed surface of said first and second electro active substrates, respectively, second electro active substrates each having a second opposed planar surface joined to an endcap having a truncated conical shape, said method comprising:

applying a first electrical field to a said first electro active substrate;

applying a second electrical field to said second electro active substrate;

wherein said first and second electrical fields have an amplitude and phase relationship such that said electro active device produces a combined flexural and bending motion, thereby producing said directional beam.

16. A vibration production system comprising:

a plurality of electro active devices for generating a directional beam of vibration arranged in an array, each electro active device having:

first and second electro active substrates each having first and second opposed continuous planar surfaces wherein each of said first opposed surfaces have a polarity and each of said second opposed surfaces have an opposite polarity, wherein said first opposed surfaces of said first and second electro active substrates are in close contact;

a first electrode coupled to a junction formed by said first opposed surfaces having the same polarity;

a second electrode coupled to said second opposed surface of said first electro active substrate;

a third electrode coupled to said second opposed surface of said second electro active substrate;

a third electrode coupled to said second opposed surface of said second electro active substrate;

a first endcap joined to said second opposed surface of said first electro active substrate; and a second endcap joined to said second opposed surface of said second electro active substrate;

first circuitry for applying a first electric field across said first and second electrodes of said electro active devices; and second circuitry independent of said first circuitry for applying a second electric field across said first and third electrodes of said electro active devices, said second electrical field having a phase relationship with said first electrical field, wherein the application of said first and second electrical fields causes an amplitude and phase relationship such that each of said electro active devices produces a combined flexural and bending motion generating a directional beam.

* * * * *

UNITED STATES PATENT AND TRADEMARK OFFICE

CERTIFICATE OF CORRECTION

PATENT NO. : 6,614,143 B2
APPLICATION NO. : 09/942272
DATED : September 2, 2003
INVENTOR(S) : Jindong Zhang and Robert E. Newnham It is certified that error appears in the above-identified patent and that said Letters Patent is hereby corrected as shown below:

Column 9
Line 44, in Claim 4, “materials” should read --material--.

Column 9
Lines 62 to 65, in Claim 9, the phrase: “wherein said first and second electrical fields have an amplitude and phase relationship such that said electro active device produces a combined flexural and bending motion” should be deleted; and should be replace by: --second electro active substrates each having a second opposed planar surface joined to an endcap having a truncated conical shape, said method comprising: applying a first electrical field to a said first electro active substrate; applying a second electrical field to said second electro active substrate, wherein said first and second electrical fields have an amplitude and phase relationship such that said electro active device produces a combined flexural and bending motion, thereby producing said directional beam.--

Column 10
Line 17, in Claim 15 “respectively,” should read --respectively.--

Lines 18 to 29, in Claim 15 should be deleted.

Signed and Sealed this

Nineteenth Day of February, 2008

JON W. DUDAS
*Director of the United States Patent and Trademark Office*